United States Patent
He et al.

(10) Patent No.: US 10,177,156 B2
(45) Date of Patent: Jan. 8, 2019

(54) STATIC RANDOM ACCESS MEMORY HAVING INSULATING LAYER WITH DIFFERENT THICKNESSES

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/491,939

(22) Filed: Apr. 19, 2017

(65) Prior Publication Data

US 2018/0269212 A1    Sep. 20, 2018

(30) Foreign Application Priority Data

Mar. 20, 2017 (TW) .............................. 106109135 A (51) Int. Cl.
| | |
|---|---|
| H01L 27/11 | (2006.01) |
| H01L 27/12 | (2006.01) |
| H01L 27/092 | (2006.01) |
| H01L 29/78 | (2006.01) |
| H01L 23/535 | (2006.01) |
| H01L 29/66 | (2006.01) |
| H01L 21/8238 | (2006.01) |

(52) U.S. Cl.
CPC .. *H01L 27/1104* (2013.01); *H01L 21/823828* (2013.01); *H01L 21/823871* (2013.01); *H01L 23/535* (2013.01); *H01L 27/092* (2013.01); *H01L 27/1203* (2013.01); *H01L 29/66484* (2013.01); *H01L 29/7831* (2013.01)

(58) Field of Classification Search
None
See application file for complete search history.

(56) References Cited

U.S. PATENT DOCUMENTS

| | | | | |
|---|---|---|---|---|
| 6,063,686 | A * | 5/2000 | Masuda | H01L 21/84 257/350 |
| 6,441,436 | B1 * | 8/2002 | Wu | H01L 27/10873 257/288 |
| 6,458,638 | B2 * | 10/2002 | Kim | H01L 21/84 257/E21.703 |
| 6,624,459 | B1 | 9/2003 | Dachtera et al. | |
| 7,791,928 | B2 | 9/2010 | Anderson et al. | |
| 8,107,279 | B2 | 1/2012 | Yamaoka et al. | |
| 8,530,287 | B2 * | 9/2013 | Cai | H01L 27/1203 257/E21.637 |
| 8,829,621 | B2 * | 9/2014 | Zhu | H01L 21/762 257/369 |
| 8,933,512 | B2 * | 1/2015 | Zhu | H01L 29/78648 257/347 |

(Continued)

*Primary Examiner* — Andres Munoz
(74) *Attorney, Agent, or Firm* — Winston Hsu (57) ABSTRACT

A method for fabricating semiconductor device includes the steps of: providing a substrate having a first region and a second region and the substrate includes a semiconductor layer on top of an insulating layer; forming a first front gate on the first region of the substrate and a second front gate on the second region of the substrate; removing part of the insulating layer under the first front gate; forming a first back gate on the insulating layer under the first front gate; and forming a second back gate under the second front gate.

10 Claims, 6 Drawing Sheets

(56) References Cited

U.S. PATENT DOCUMENTS

| | | | | |
|---|---|---|---|---|
| 9,536,788 B1* | 1/2017 | Ning | ............... | H01L 21/8228 |
| 2005/0242398 A1* | 11/2005 | Chen | ............. | H01L 21/76267 |
| | | | | 257/348 |
| 2010/0258812 A1* | 10/2010 | Eri | ..................... | C30B 25/02 |
| | | | | 257/76 |
| 2012/0256260 A1* | 10/2012 | Cheng | .......... | H01L 21/26506 |
| | | | | 257/347 |
| 2013/0146959 A1* | 6/2013 | Cheng | .......... | H01L 29/66181 |
| | | | | 257/310 |

* cited by examiner

STATIC RANDOM ACCESS MEMORY HAVING INSULATING LAYER WITH DIFFERENT THICKNESSES

BACKGROUND OF THE INVENTION

1. Field of the Invention

The invention relates to a semiconductor device, and more particularly to a stack random access memory (SRAM) device and fabrication method thereof.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However, as pitch of the exposure process decreases, it has been difficult for current SRAM architecture to produce desirable patterns. Hence, how to enhance the current SRAM architecture for improving exposure quality has become an important task in this field.

SUMMARY OF THE INVENTION

According to an embodiment of the present invention, a method for fabricating memory device includes the steps of: providing a substrate having a first region and a second region and the substrate comprises a semiconductor layer on top of an insulating layer; forming a first front gate on the first region of the substrate and a second front gate on the second region of the substrate; removing part of the insulating layer under the first front gate; forming a first back gate on the insulating layer under the first front gate; and forming a second back gate under the second front gate.

According to another aspect of the present invention, a memory device includes: a substrate having a first region and a second region and the substrate includes a semiconductor layer on top of an insulating layer and a thickness of the insulating on the first region is different from a thickness of the insulating layer on the second region; a first front gate on the first region of the substrate and a second front gate on the second region of the substrate; a first back gate on the insulating layer under the first front gate; and a second back gate on the insulating layer under the second front gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
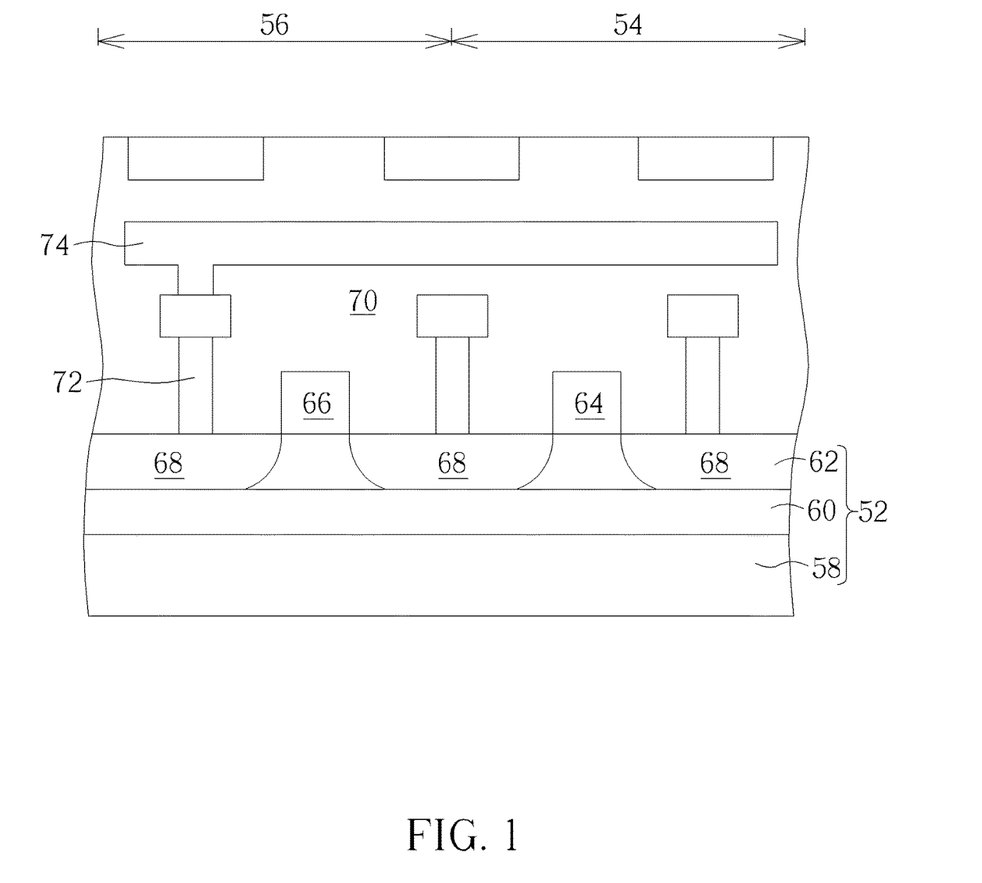
FIGS. 1-3 illustrate a method for fabricating a SRAM device according to a preferred embodiment of the present invention.
Figure 2:
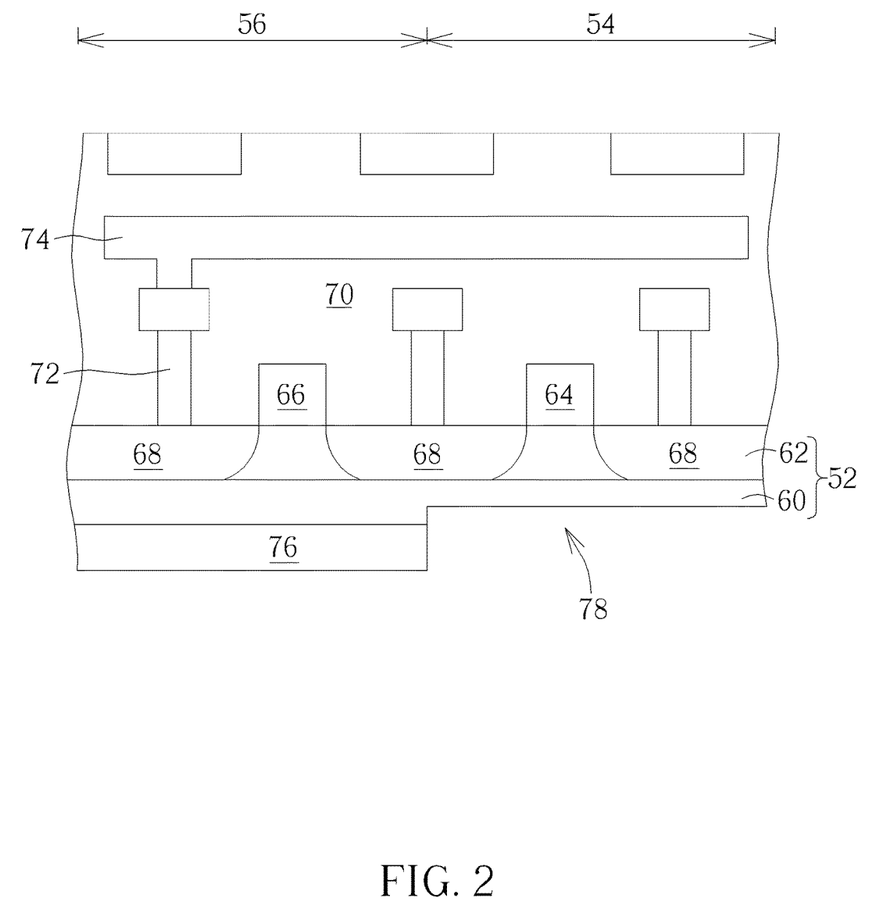
Figure 3:
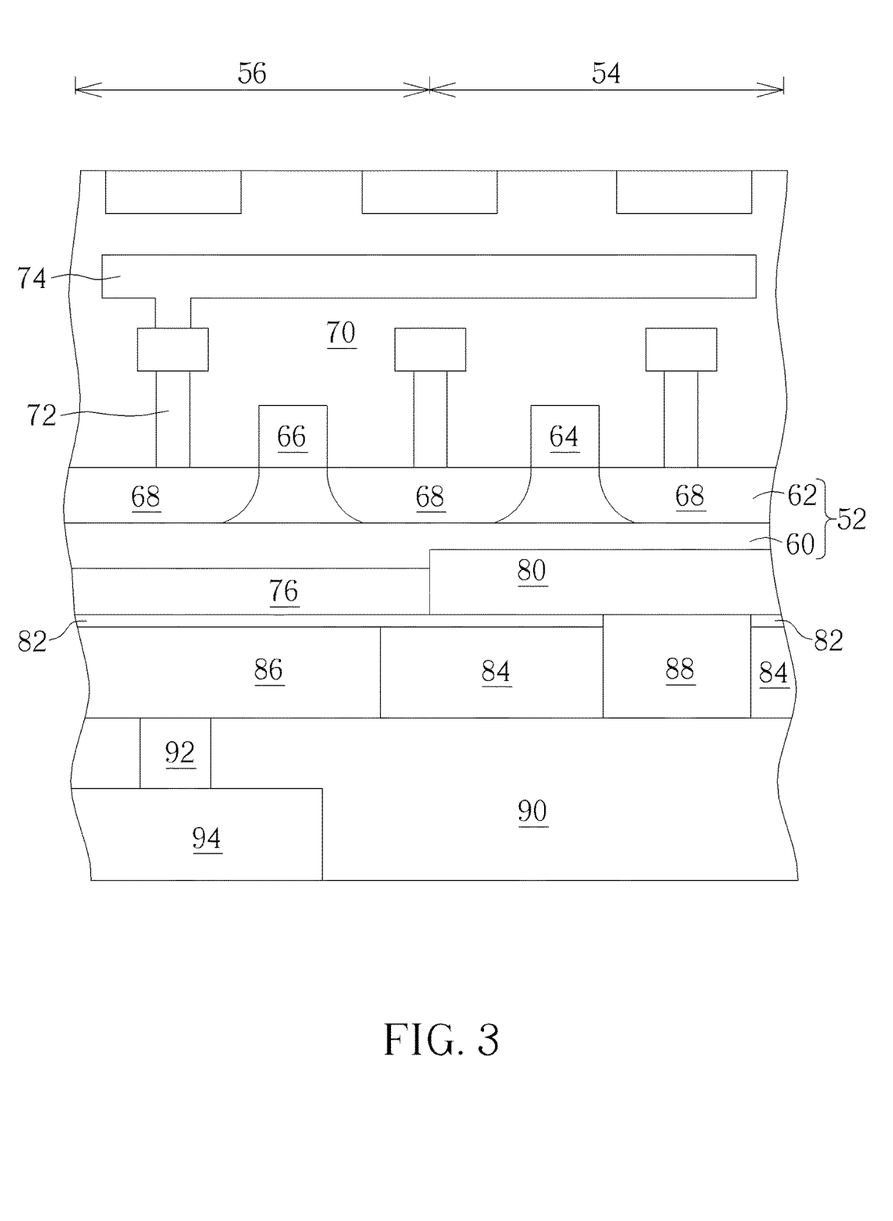

Referring to FIGS. 1-3, FIGS. 1-3 illustrate a method for fabricating a SRAM device according to a preferred embodiment of the present invention. As shown in FIG. 1, a substrate 52 is first provided and a first region 54 and a second region 56 are defined on the substrate 52. In this embodiment, the substrate 52 preferably includes a silicon-on-insulator (SOI) substrate, in which the SOI substrate further includes first semiconductor layer such as a bottom or base silicon layer 58, an insulating layer 60 on the base silicon 58, and a second semiconductor layer such as a top silicon layer 62 on the insulating layer 60. The insulating layer 60 is preferably made of silicon oxide, but not limited thereto.

Next, a first front gate 64 is formed on the substrate 52 on the first region 54 and a second front gate 66 is formed on the substrate 52 on the second region 56. In this embodiment, the formation of the first front gate 64 and the second front gate 66 could be accomplished by first depositing a gate dielectric layer (not shown) and a gate material layer (not shown) on the substrate 54, and then using a photo-etching process to remove part of the gate material layer and part of the gate dielectric layer to form the first front gate 64 and the second front gate 66. The gate dielectric layer could be made of material such as but not limited to for example $SiO_2$, SiN, or high-k material. If the first front gate 64 and the second front gate 66 were made of metal, each of the front gates 64 and 66 could further includes a high-k dielectric layer, a U-shaped metal layer, and a low resistance metal layer.

In this embodiment, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer is formed for tuning the work function of the metal gate in accordance with the conductivity of the device. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Next, at least a spacer (not shown) could be formed on the sidewalls of each of the first front gate 64 and second front gate 66, and source/drain regions 68 are formed in the substrate 52 adjacent to two sides of the spacer. In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 68 could include n-type dopants or p-type dopants depending on the type of device being fabricated. In this embodiment, the first front gate 64 and second front gate 66 preferably includes same conductive type, such as both being NMOS transistors, but not limited thereto.

Next, a first dielectric layer 70 such as an interlayer dielectric (ILD) layer is formed on the substrate 52 to cover the first front gate 64 and the second front gate 66, and a contact plug formation and metal interconnect process are conducted to form contact plugs 72 in the first dielectric layer 70 physically contacting the source/drain regions 68 and electrically connecting the first front gate 64 and second front gate 66 and metal interconnections 74 connecting the contact plugs 72. In this embodiment, the first dielectric layer 70 could include tetraethyl orthosilicate (TEOS), the metal interconnections 74 could include Al, Cr, Cu, Ta, Mo, W, or combination thereof and most preferably Cu, and the contact plugs 72 preferably include W, but not limited thereto.

The above process pertains to the fabrication of a top portion of the SRAM device in this embodiment and after the fabrication of the top portion including metal interconnections 74 connecting the first front gate 64 and second front gate 66 is completed, as shown in FIG. 2, it would be desirable to flip or reverse the entire substrate 52 so that the bottom surface of the base silicon layer 58 is faced upward. Next, an etching process is conducted to remove the bottommost base silicon layer 58 of the SOI substrate so that the surface of the insulating layer 60 is exposed. Next, the fabrication of the lower or bottom portion of the SRAM device including the fabrication of back gates is continued thereafter.

It should be noted that to clearly demonstrate the overall structure of the memory device, the process onward or the passages afterwards will be described in the manner according to the state before the substrate 52 is reversed, hence the sequence for fabricating the back gates will begin from the bottom of the insulating layer 60 and working downward as shown in FIG. 2. Moreover, since the fabrication of the back gates is conducted from the bottom of the insulating layer 60 downward, the description of a device or element being disposed "on" the substrate 52 in the later passages merely indicates the action of disposing such element or device instead of indicating the actual position of the element being disposed directly. For instance, as shown in FIG. 2, after the base silicon layer 58 is removed to expose the bottom surface of the insulating layer 60, a photo-etching process is conducted to remove part of the insulating layer 60 directly under the first front gate 64 on the first region 54 so that the thickness of the insulating layer 60 on the first region 54 is different from the thickness of the insulating layer 60 on the second region 56. Specifically, the thickness of the insulating layer 60 on the first region 54 is now lower than the thickness of the insulating layer 60 on the second region 56.

Next, a second dielectric layer 76 is formed on the insulating layer 60 or as indicated in FIG. 2 a second dielectric layer 76 is formed on the bottom surface of the insulating layer 60, and a photo-etching process is conducted to remove part of the second dielectric layer 76 on the first region 54 for forming a recess or opening 78 exposing the bottom of the insulating layer 60 on the first region 54.

Next, as shown in FIG. 3, a first back gate 80 is formed in the opening 78 or on the bottom of the insulating layer 60 directly under the first front gate 64, in which the bottom surface of the second dielectric layer 76 is even with the bottom surface of the first back gate 80. In this embodiment, the second dielectric layer 76 and the first dielectric layer 70 could be made of same material or different material, in which the second dielectric layer 76 preferably includes silicon oxide or TEOS and the first back gate 80 could include Al, Cr, Cu, Ta, Mo, W, or combination thereof and most preferably Cu.

It should be noted that even though the aforementioned approach removes part of the insulating layer 60 on the first region 54 before forming the second dielectric layer 76 on the insulating layer 60, according to an embodiment of the present invention, it would also be desirable to directly form the second dielectric layer 76 on the insulating layer 60 without removing any of the insulating layer 60, and then using a photo-etching process to remove part of the second dielectric layer 76 and part of the insulating layer 60 on the first region 54 or directly under the first front gate 64 at the same time to form the opening 78 as shown in FIG. 2 so that the thickness of the insulating layer 60 on the first region 54 is slightly lower than the thickness of the insulating layer 60 on the second region 56.

In other words, in contrast to the aforementioned approach of using two photo-etching process to remove part of the insulating layer 60 and part of the second dielectric layer 76 separately, this approach only requires one photo-etching process to be conducted to form the opening 78 as shown in FIG. 2, which are all within the scope of the present invention. After the opening 78 is formed, same approach could be conducted to form the first back gate 80 in the opening 78 so that the bottom surface of the first back gate 80 is even with the bottom surface of the second dielectric layer 76.

Next, a high-k dielectric layer 82 is formed on the second dielectric layer 76 and the first back gate 80. In this embodiment, the high-k dielectric layer 82 is preferably selected from dielectric materials having dielectric constant (k value) larger than 4. For instance, the high-k dielectric layer 82 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, it would be desirable to selectively remove part of the high-k dielectric layer 82 on the first region 54 for exposing the bottom surface of part of the first back gate 80, and a third dielectric layer 84 is formed on the bottom surface of the high-k dielectric layer 82. Next, part of the third dielectric layer 84 is removed to form openings (not shown) exposing the part of the bottom surface of high-k dielectric layer 82 on both first region 54 and second region 56, and second back gate 86 is formed in the opening on the second region 56 under the high-k dielectric layer 82 and a third back gate 88 is formed in the opening on the first region 54 and directly under the first back gate 80. Since part of the high-k dielectric layer 82 on the first region 54 is removed beforehand, the third back gate 88 preferably contacts the first back gate 80 directly and the bottom surfaces of the third back gate 88 and second back gate 86 are coplanar.

It should be noted that even though part of the high-k dielectric layer 82 on the first region 54 is removed prior to the formation of second back gate 86 and third back gate 88 in the above embodiment, according to an embodiment of the present invention, it would also be desirable to not removing any of the high-k dielectric layer 82 before forming the second back gate 86 and third back gate 88 so that the top and bottom surfaces of the second back gate 86 would be even with the top and bottom surfaces of the third back gate 88, which is also within the scope of the present invention.

Next, contact plug formation and metal interconnect process could be conducted to form a fourth dielectric layer 90 on the third dielectric layer 84, and form contact plugs 92 in the fourth dielectric layer 90 electrically connecting the second back gate 86 and fourth back gate 94 connecting the contact plug 92. In this embodiment, the third dielectric layer 84 and fourth dielectric layer 90 could be made of same material or different material from the second dielectric layer 76. For instance, the three dielectric layers 76, 84, 90 could all include material such as but not limited to for example silicon oxide or TEOS. The first back gate 80, second back gate 86, third back gate 88, fourth back gate 94, and contact plugs 92 could also be made of same material or different material. For instance, the first back gate 80, second back gate 86, third back gate 88, fourth back gate 94, and contact plugs 92 could include Al, Cr, Cu, Ta, Mo, W, or combination thereof and most preferably Cu. This completes the fabrication of a memory device according to a preferred embodiment of the present invention.

It should be noted that the main characteristics of the aforementioned embodiment preferably removes part of the insulating layer 60 under the first front gate 64 on first region 54 as shown in FIG. 2 so that the thickness of the insulating layer 60 on the first region 54 is different from the thickness of the insulating layer 60 on the second region 56. Next, back gates are formed on the backside of the substrate 52 corresponding to the front gates on each of the first region 54 and second region 56. By doing so, the back gates could apply different threshold voltages to the front gates on first region 54 and second region 56 separately during operation so that not only the beta ratio of the entire memory could be adjusted accordingly but also better read margin could be achieved.

Figure 4:
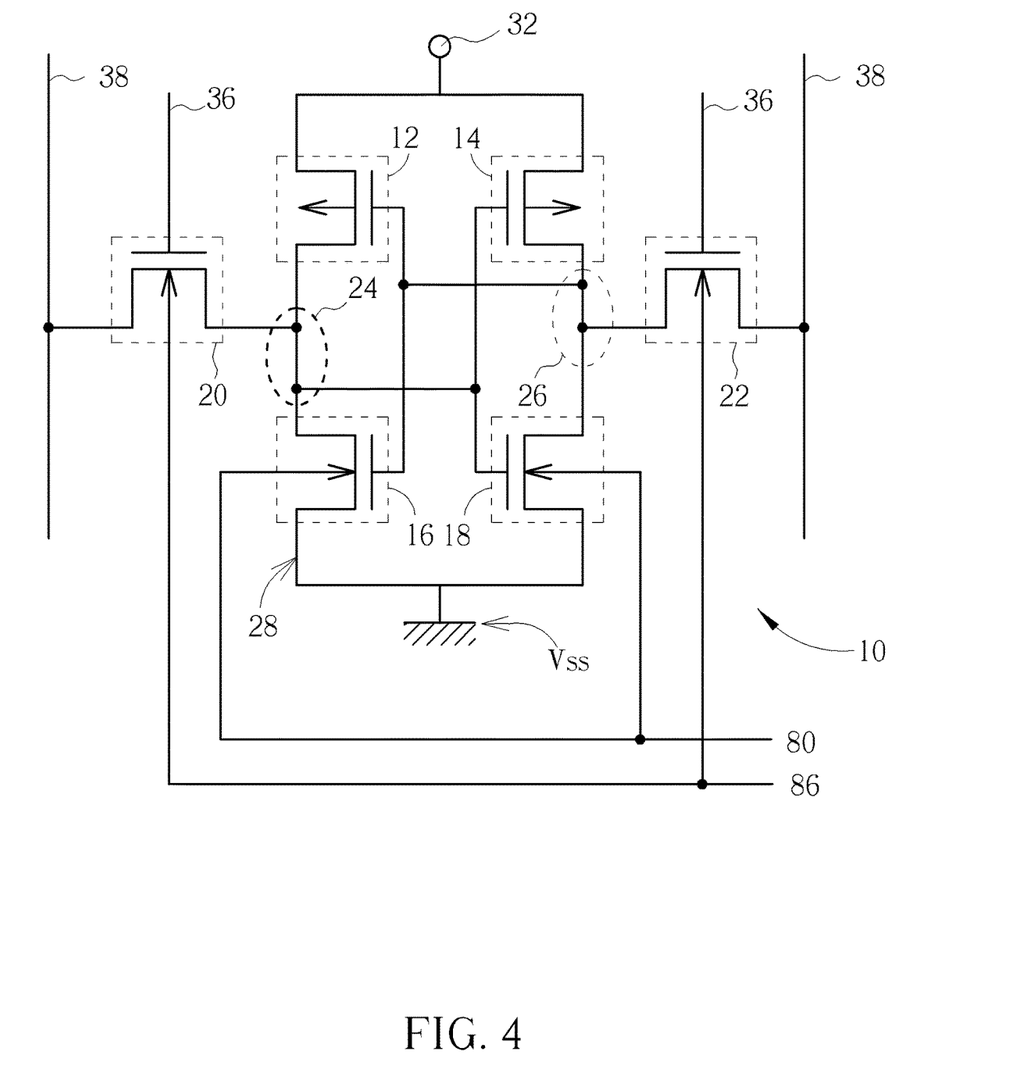
FIG. 4 illustrates a circuit diagram of a SRAM according to an embodiment of the present invention.
Figure 5:
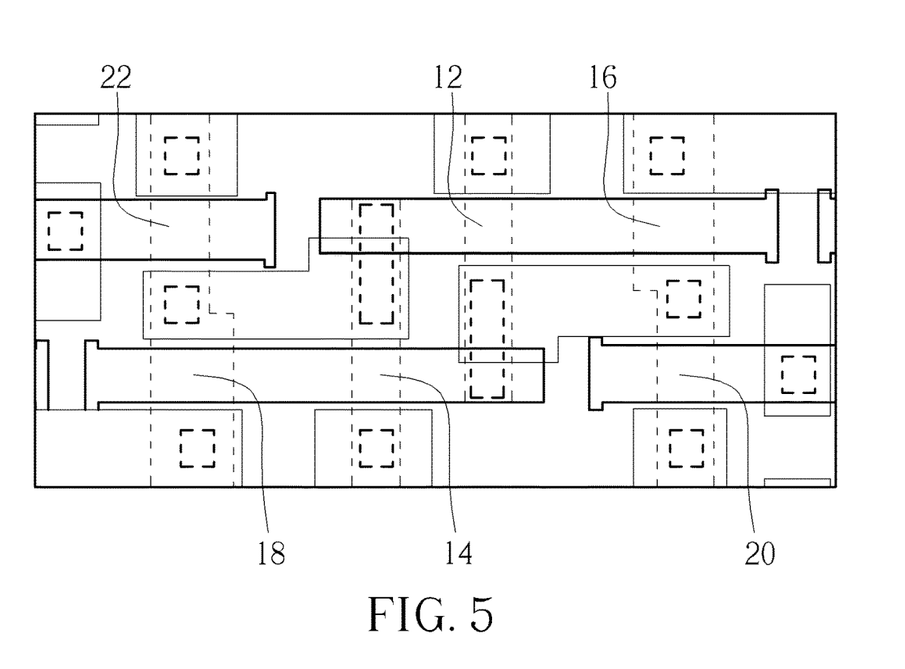
FIG. 5 illustrates a layout diagram of a SRAM of the present invention.

Referring to FIGS. 4-5, FIG. 4 illustrates a circuit diagram of a SRAM according to an embodiment of the present invention and FIG. 5 illustrates a layout diagram of the SRAM of the present invention. As shown in FIGS. 4-5, the SRAM device of the present invention preferably includes a six-transistor SRAM (6T-SRAM) cell 10. In this embodiment, the 6T-SRAM cell 10 is composed of pull-up transistors 12 and 14, pull-down transistors 16 and 18, and access or pass transistors 20 and 22. These six transistors constitute a set of flip-flops. Pull-up transistors 12 and 14 and pull-down transistors 16 and 18 constitute a latch that stores data in the storage nodes 24 and 26. Since the pull-up transistors 12 and 14 act as power load devices, they can be replaced by resistors. Under this circumstance, the static random access memory becomes a four-transistors SRAM (4T-SRAM). In this embodiment, the pull-up transistors 12 and 14 preferably share a source/drain region and electrically connected to a voltage source 32 (such as Vcc), the pull-down transistors 16 and 18 share a source/drain region and electrically connected to a voltage source 34 (such as Vss), and the first SRAM cell 40 and second SRAM cell 42 are arranged symmetrically while being mirror images to each other so that the source/drain region shared by the pull-down transistors 16 and 18 of the first SRAM cell 40 is electrically connected to the source/drain region shared by the pull-up transistors 12 and 14 of the second SRAM cell 42.

Preferably, the pull-up transistors 12 and 14 of the 6T-SRAM cell 10 are composed of p-type metal oxide semiconductor (PMOS) transistors, the pull-down transistors 16 and 18 and the pass transistors 20 and 22 are composed of n-type metal oxide semiconductor (NMOS) transistors. The pull-up transistor 12 and the pull-down transistor 16 constitute an inverter, which further form a series circuit 28. One end of the series circuit 28 is connected to a voltage source 32 and the other end of the series circuit 28 is connected to a voltage source 34. Similarly, the pull-up transistor 14 and the pull-down transistor 18 constitute another inverter and a series circuit 30. One end of the series circuit 30 is connected to the voltage source 32 and the other end of the series circuit 30 is connected to the voltage source 34.

The storage node 24 is connected to the respective gates of the pull-down transistor 18 and the pull-up transistor 14. The storage node 24 is also connected to the drains of the pull-down transistor 16, pull-up transistor 12, and the pass transistor 20. Similarly, the storage node 26 is connected to the respective gates of the pull-down transistor 16 and the pull-up transistor 12. The storage node 26 is also connected to the drains of the pull-down transistor 18, pull-up transistor 14, and the access transistor 22. The gates of the pass transistors 20 and 22 are respectively coupled to a word line 36, and the sources are coupled to a relative data line 38.

In this embodiment, the first front gate 64 shown in FIG. 2 preferably belongs to one of the pull-down transistors 16 and 18, the second front gate 66 preferably belongs to one of the pass transistors 20, 22, and each of the first front gate 64 and second front gate 66 preferably includes a NMOS transistor. As shown in FIG. 4, it would be desirable to transmit different threshold voltages from the first back gate 80 and second back gate 86 to the first front gate 64 (or pull-down transistor) and second front gate 66 (or pass transistor) at the same time.

Figure 6:
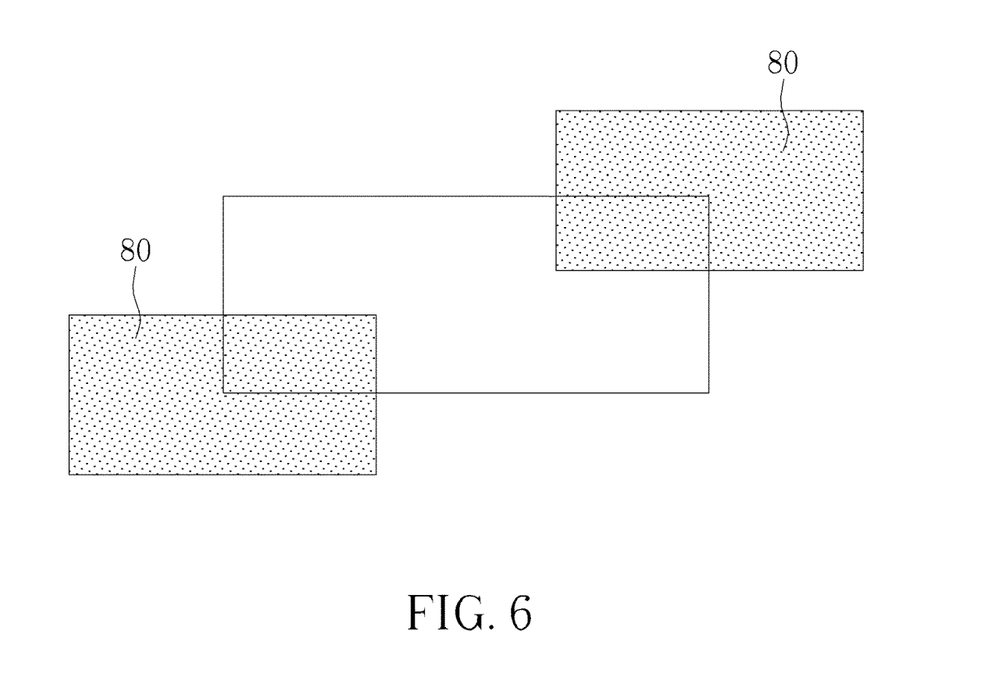
FIG. 6 is a top view illustrating the coverage area of the first back gate shown in FIG. 3 in the SRAM device.
Figure 7:
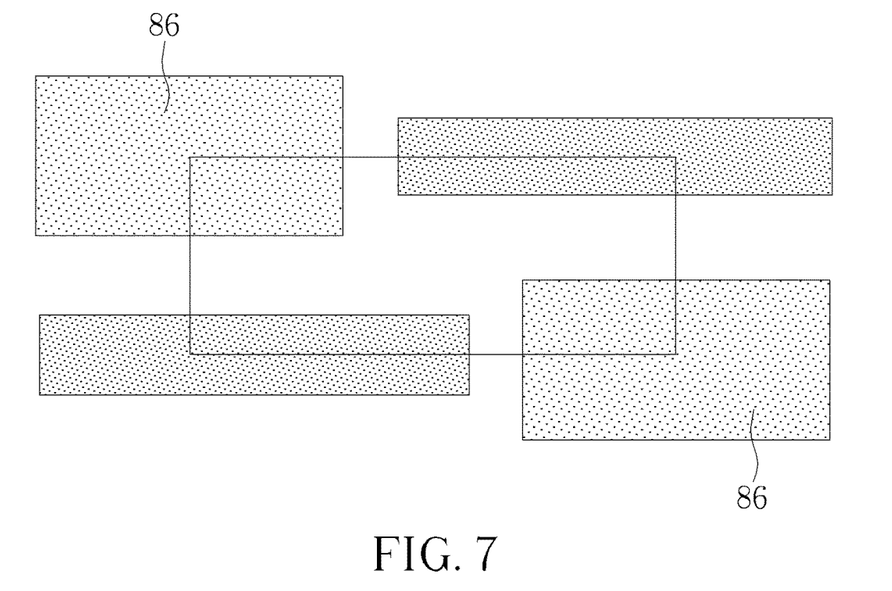
FIG. 7 is a top view illustrating the coverage area of the second back gate shown in FIG. 3 in the SRAM device.
Figure 8:
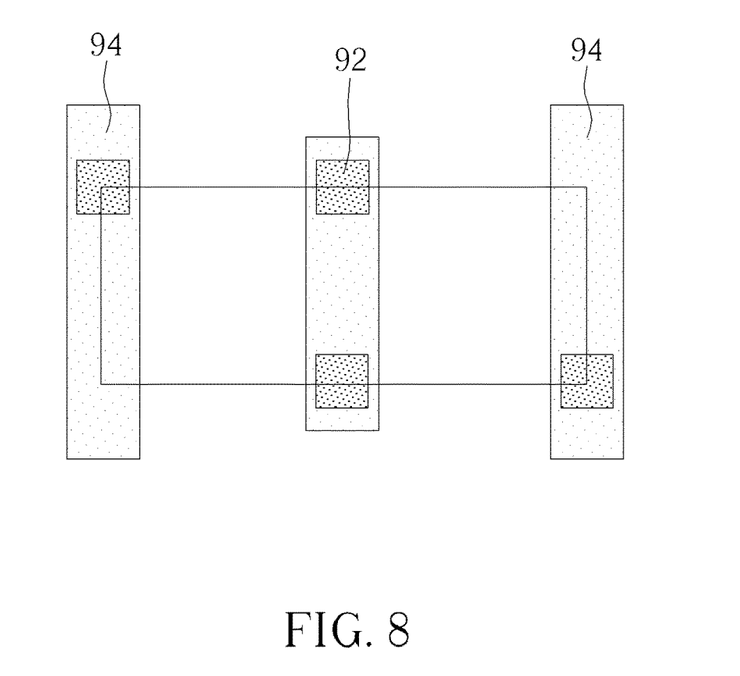
FIG. 8 is a top view illustrating the coverage area of the fourth back gate shown in FIG. 3 in the SRAM device.

Referring to FIGS. 6-8, FIGS. 6-8 illustrate top views of coverage areas of back gates relative to the entire SRAM device from the aforementioned embodiments, in which FIG. 6 is a top view illustrating the relative coverage area of the first back gate shown in FIG. 3 in the SRAM device, FIG. 7 is a top view illustrating the relative coverage area of the second back gate shown in FIG. 3 in the SRAM device, and FIG. 8 is a top view illustrating the relative coverage area of the fourth back gate shown in FIG. 3 in the SRAM device.

As shown in FIG. 6, the first back gate 80 shown in FIG. 3 preferably covers the transistors on both top right corner and lower left corner of the SRAM device as shown in FIG. 5. For instance, the first back gate 80 preferably covers the two pull-down transistors 16, 18 in the SRAM.

As shown in FIG. 7, the second back gate 86 shown in FIG. 3 preferably covers the transistors on both top left corner and lower right corner of the SRAM device shown in FIG. 5. Specifically, the second back gate 86 covers the two pass transistors 20, 22 in the SRAM.

As shown in FIG. 8, the fourth back gate 94 shown in FIG. 3 could selectively cover the two pull-up transistors 12, 14 on the middle region of SRAM device shown in FIG. 5 while not covering any of the pull-down transistors 16, 18 and pass transistors 20, 22.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a first region and a second region, wherein the substrate comprises a semiconductor layer on top of an insulating layer and the insulating layer contacts the semiconductor layer directly;
   a first front gate electrode on the first region of the substrate and a second front gate electrode on the second region of the substrate, wherein a total thickness of the insulating layer directly under the first front gate electrode is different from a total thickness of the insulating layer directly under the second front gate electrode;
   a first back gate on the insulating layer under the first front gate electrode; and
   a second back gate on the insulating layer under the second front gate electrode.

2. The semiconductor device of claim 1, further comprising:
   a first dielectric layer on the substrate to cover the first front gate electrode and the second front gate electrode; and
   first contact plugs in the first dielectric layer to electrically connect the first front gate electrode and the second front gate electrode.

3. The semiconductor device of claim 2, further comprising:
   a second dielectric layer on the insulating layer and adjacent to the first back gate.

4. The semiconductor device of claim 3, wherein bottom surfaces of the second dielectric layer and the first back gate are coplanar.

5. The semiconductor device of claim 3, further comprising a high-k dielectric layer on the second dielectric layer and the first back gate.

6. The semiconductor device of claim 1, further comprising a third back gate under the first back gate, wherein bottom surfaces of the second back gate and the third gate are coplanar.

7. The semiconductor device of claim 6, wherein the first back gate and the third back gate are disposed within the first region under the first front gate electrode.

8. The semiconductor device of claim 6, wherein the first back gate contacts the third back gate directly.

9. The semiconductor device of claim 6, further comprising:
   a third dielectric layer on the second back gate and the third back gate;
   a second contact plug on the second back gate; and
   a fourth back gate on the second contact plug.

10. The semiconductor device of claim 9, wherein the second back gate and the fourth back gate are disposed within the second region under the second front gate electrode.

* * * * *